US009627835B2

(12) United States Patent
King, Jr. et al.

(10) Patent No.: US 9,627,835 B2
(45) Date of Patent: Apr. 18, 2017

(54) METHOD OF ASSEMBLING SEALANT CONTAINING TWIST-ON WIRE-CONNECTORS

(71) Applicants: Lloyd Herbert King, Jr., Chesterfield, MO (US); James C. Keeven, O'Fallon, MO (US)

(72) Inventors: Lloyd Herbert King, Jr., Chesterfield, MO (US); James C. Keeven, O'Fallon, MO (US)

(73) Assignee: PATENT STORE, LLL, O'Fallon, MO (US)

( * ) Notice: Subject to any disclaimer, the term of this patent is extended or adjusted under 35 U.S.C. 154(b) by 121 days.

(21) Appl. No.: 14/544,785

(22) Filed: Feb. 18, 2015

(65) Prior Publication Data

US 2015/0171585 A1 Jun. 18, 2015

Related U.S. Application Data

(62) Division of application No. 12/284,069, filed on Sep. 18, 2008, now Pat. No. 8,997,347.

(51) Int. Cl.

*H01R 43/00* (2006.01)
*H05K 13/00* (2006.01)
*H01R 43/24* (2006.01)
*H01R 4/22* (2006.01)

(52) U.S. Cl.

CPC ............... *H01R 43/24* (2013.01); *H01R 4/22* (2013.01); *H01R 43/00* (2013.01); *Y10T 29/49004* (2015.01); *Y10T 29/49201* (2015.01); *Y10T 29/49208* (2015.01); *Y10T 29/49211* (2015.01); *Y10T 29/49224* (2015.01); *Y10T 29/5137* (2015.01)

(58) Field of Classification Search

CPC .......... H01R 4/22; H01R 43/00; H01R 43/24; Y10T 29/49201; Y10T 29/49224; Y10T 29/49211; Y10T 29/5137; Y10T 29/49004; Y10T 29/49208

USPC ....... 29/768, 825, 874, 885; 174/74 A, 74 R, 174/84, 87, 138 F; 439/488, 521, 736

See application file for complete search history.

(56) References Cited

U.S. PATENT DOCUMENTS 3,597,528 A * 8/1971 Penfield .................. H01R 4/22 174/76
4,740,656 A * 4/1988 Rich ........................ H01R 4/22 174/84 S
5,151,239 A * 9/1992 King, Jr. .................. H01R 4/22 174/87
5,771,578 A * 6/1998 King, Jr. .................. H01R 4/22 29/885

* cited by examiner

*Primary Examiner* — Donghai D Nguyen
(74) *Attorney, Agent, or Firm* — Jacobson & Johnson LLC

(57) ABSTRACT

An improved method of making sealant containing twist-on wire connectors from a batch of components, wherein some of the components may be preassembled through automated equipment and at least one or more of the steps performed in the making of a sealant containing twist-on wire connector is performed manually at a station where an operator can simultaneously perform one or more steps to enhance the formation of a twist-on wire connector containing a sealant while at the same time eliminating upfront investments costs for a work station as well as costs for maintenance of a work station.

7 Claims, 6 Drawing Sheets

METHOD OF ASSEMBLING SEALANT CONTAINING TWIST-ON WIRE-CONNECTORS

CROSS REFERENCE TO RELATED APPLICATIONS

This application is a divisional application of application Ser. No. 12/284,069 filed on Sep. 18, 2008 titled Assembling Sealant Containing Twist-On Wire Connectors now U.S. Pat. No. 8,997,347.

FIELD OF THE INVENTION

This invention relates generally to twist-on wire connectors and, more specifically, to improvements to a process of making sealant containing twist-on wire connectors.

STATEMENT REGARDING FEDERALLY SPONSORED RESEARCH OR DEVELOPMENT

None

REFERENCE TO A MICROFICHE APPENDIX

None

BACKGROUND OF THE INVENTION

Twist-on wire connectors are well known in the art and generally comprise a hard shell with a spiral wire core located in a cavity in the shell. The ends of wires, which are to be connected together, are inserted into contact with the spiral wire core and the wires and twist-on wire connector are rotated with respect to each other to bring the electrical wires into electrical contact with each other. Typically, such wire connectors are assembled on automated machines that form the coil and the hard shell and automatically insert the the coil into the hard shell.

A modified twist-on wire connector, for example a waterproof twist-on wire connector, is a conventional twist-on wire connector that contains a sealant. The sealant containing twist-on wire connector generally comprise a hard shell, a coil, a wire penetrateable end cap and a sealant which has been injected into the cavity of the coil.

The manufacturer of twist-on wire connectors containing a sealant involves a number of steps including the formation of components for the twist-on wire connector, assembly of the components and the injection of sealant into a cavity in the spiral coil of the twist-on wire connector. As the components are generally small in size, i.e. about two inches or less in length the components can and have been readily assembled by automated apparatus. The components which can be assembled by automated apparatus can also be injected with sealant through an automated apparatus, however, one of the difficulties in assembling twist-on wire connectors with a sealant is to eliminate any faulty assembled twist-on wire connectors as well as those twist-on wire connectors that have do not have the proper amount of sealant.

An automated method and apparatus for making sealant containing twist-on wire connectors from basic components is shown in U.S. Pat. No. 5,771,578. This apparatus though use of numerous sensors addresses one of the difficulties in making twist-on wire connectors, which is to ensure that the sealant containing twist-on wire connectors are properly assembled. Typically, the components such as the shell and coil need to be assembled before a sealant can be injected into the coil. Occasionally, the coil or the sealant may not be properly assembled or the coil or the shell may not have been properly formed. In either case the result can be a faulty product. In order to minimize faulty products the U.S. Pat. No. 5,771,578 discloses an automated system that uses a number of optical sensors to detect the presence of components for assembly. A first sensor detects if the shells are being properly fed into the peripheral slots of a rotating table. A second sensor detects if the coils, are being properly fed to a rotating assembly table. A third sensor determines if the coil is properly positioned in the shell and a fourth optical sensors determines if the caps are in position. Further optical sensors are used to determine if the coil is properly positioned in the shell. If the optical sensors detect that one or more of the twist-on wire connector components is not present on the assembly table or if the twist-on wire connector does not contain the proper amount of sealant the twist-on wire connector is rejected and is sent to a recycle bin.

The benefits of automation over manual assembly in reducing manufacturing cost in numerous industries are well known, however, while such automated systems using optical sensors can be used to form sealant containing wire connectors it requires an investment in specialized machinery not only for assembly of the components but also for injecting sealant into the twist-on wire connectors. To build systems to automatically perform both formation and assembly steps can be costly as well as costly to maintain the equipment for making assembled twist-on wire connectors. Typically, errors in settings or calibration of the optical sensors may result in unnecessary discarding of useable twist-on wire connectors or may allow connectors to pass that should have been sent to the recycle bin. A further disadvantage is that such machines may be useable for only one shape or size of components which may be used in the manufacture a waterproof twist-on connectors. Typically, a number of different sizes of wire connectors may be required by a customer. In contrast to use of increased automation the present invention provides an improvement to the process of forming twist-on wire connectors with a sealant therein through selectively reducing automation in the manufacture of a twist-on wire connector containing a sealant.

SUMMARY OF THE INVENTION

An improved method of making sealant containing twist-on wire connectors from a batch of components, wherein some of the components may be preassembled through automated equipment and at least one or more of the steps performed in the making of a sealant containing twist-on wire connector is performed manually at a station where an operator can simultaneously perform one or more steps to enhances the assembly process while at the same time eliminating upfront investments costs for a work station as well as costs for maintenance of a work station maintenance. In addition, the improved method may also minimize rejection of useable sealant containing twist-on wire connectors since on-the-go decisions on the acceptability of a sealant containing twist-on wire connector can be made by a station operator.

DESCRIPTION OF THE PREFERRED EMBODIMENT

Figure 1:
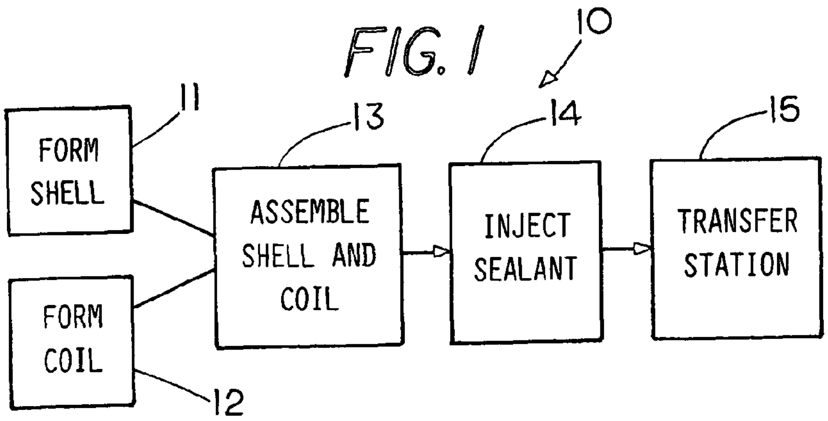
FIG. 1 shows a block diagram of an example of a system for generating a sealant containing twist-on wire connector.
Figure 3:
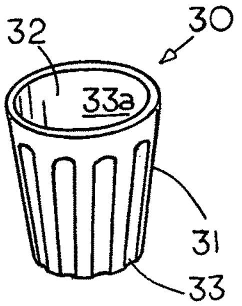
FIG. 3 shows a perspective view of a shell of a twist-on wire connector.
Figure 4:
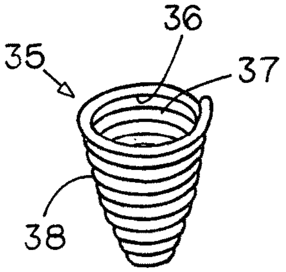
FIG. 4 shows a perspective view of a spiral coil of a twist-on wire connector.

FIG. 1 shows a block diagram of a system 10 for generating a sealant containing twist-on wire connector. System 10 includes a station 11 wherein a component such as hard shell for a twist-on wire connector is formed. Typically, the hard shell can be formed by molding although other methods of forming the hard shell may be used. An example of a hard shell 30 is illustrated in FIG. 3 and comprises a cylindrical tube like member 31 with a closed end 33 and an open end 32 forming an interior pocket 33*a* therein. Example of hard shells for twist-on wire connecters can be found in U.S. Pat. No. 5,023,402. A further component is a coil 35, which is shown in FIG. 4, with the coil having a spiral shape with an inner cavity 37 and an outer surface 38 for engaging the interior of wire connector shell 30 and a wire engaging surface 36 for engaging wires to hold the wires in a cavity 37 located in coil 35.

Figure 5:
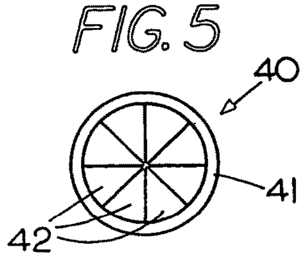
FIG. 5 shows a top view of an end cap for of a twist-on wire connector.

FIG. 5 shows a top view of a further component of a twist-on wire connector that may be used in the method of forming twist-on wire connectors with a sealant therein. In some cases one may want to inject sealant into twist-on wire connectors with end caps while in other cases one may inject sealant into twist-on wire connectors without end caps. If it is desired to place end caps on the twist-on wire connectors FIG. 5 shows a typical wire penetrable cap 40 for attachment to an open end of wire connector shell 30. Wire penetrable cap 40 includes an outer rim 41 for securing to the shell of the twist-on wire connectors with the wire penetrable cap 40 having a set of pie shaped resilient flexible flaps 42 that can close the end of the wire connector but permit insertion of wires therein. An example of a wire penetrable cap can be found in U.S. Pat. No. 5,113,037.

FIG. 1 shows an example of a system 10 for formation of twist-on wire connectors that contain a sealant. System 10 includes a component formation station 11 for forming a hard shell for the twist-on wire connector. System 10 includes a further component formation station 12 for forming a coil, preferably a spiral, metal, coil having external dimensions such that one can insert and lock the spiral coil into a pocket in the hard shell. FIG. 4 shows a perspective view of a typical spiral coil 35 having an outer spiral face 38 and inner spiral face 36 and a cavity 37 for insertion of electrical wires therein.

System 10 also includes an assembly station 13 wherein the components, i.e. the hard shell and the spiral coil, are assembled to form a twist-on wire connector. Such twist-on wire connectors have been conventionally and widely used to hold two or more wires in electrical contact with each other without the presence of a sealant therein as evidenced by U.S. Pat. No. 5,894,110. While the assembled twist-on wire connectors formed in station 13 have been in extensive use without the presence of sealant therein the present invention is directed toward the formation of a sealant containing twist-on wire connector. In order to generate a sealant containing twist-on wire connector a sealant needs to be injected into the cavity formed by the interior spiral walls of the coil.

System 10 includes a station 14 for injecting sealant into a twist-on wire connector. An automated method of inserting sealant into the cavity of a coil is shown in U.S. Pat. No. 5,771,778. Once the sealant is injected into the coil of a twist-on wire connector the twist-on wire connector containing a sealant therein is placed in a transfer station 15. Transfer station may be a bin for receiving the wire connectors to allow for various uses, for example, temporary storage, direct shipment to a customer or transfer a further station where the twist-on wire connectors are packaged in blister packs or the like. As described herein a number of different types of steps are involved including both component formation and component assembly before the sealant can be injected into the twist-on wire connector.

Figure 2:
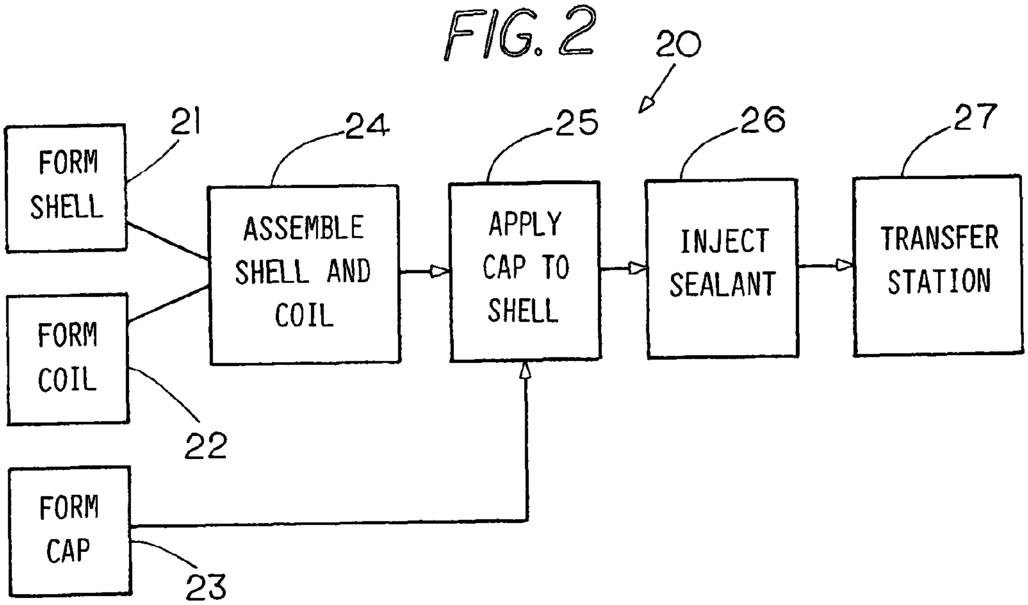
FIG. 2 shows a block diagram of an example of an alternate system for generating a sealant containing twist-on wire connector with an end cap.

FIG. 2 shows a block diagram of an example of an alternate system 20 for generating a sealant containing twist-on wire connector with an end cap. System 20 is similar to system 10 and includes a station 21 for forming a twist-on wire connector shell. Typically, the shell, which is usually hard, can be formed by molding although other methods of forming a shell may be used. Station 21 may be identical to station 11 in that the both stations can generate a shell for use in forming a twist-on wire connector.

System 20 also includes a coil forming station 22 wherein a coil, preferably a spiral shaped metal coil, is formed with the spiral coil having external dimensions such that one can insert the spiral coil into a pocket in the shell formed in station 21. Station 22 may be identical to station 12 in that the both stations 12 and 22 generate a coil for use in forming a twist-on wire connector.

System 20 includes a cap forming station 23 for forming a wire penetrateable end cap. The end cap 40 is shown in FIG. 5 and also may be found in U.S. Pat. No. 5,113,037 which is hereby incorporated by reference. Typically, end cap 40 may contain a peripheral bead that allows the end cap bead to snap into a circular groove on the inside of the shell.

System 20 includes an assembly station 24 wherein the shell and the spiral coil are assembled to form a conventional ready to use twist-on wire connector. Station 24 may be identical to station 13 in that the both stations 24 and 13 can assemble a spiral core and a hard shell.

System 20 differs from system 10 in that in system 20 a further station 25 applies a wire penetrable end cap 40 to the shell formed in station 21. Typically, as shown in FIG. 5, penetrable end cap 40 includes an other rim 41 and a set of flexible pie shaped segments 42 that can flex to allow insertion of wires into a cavity in the coil located in the to the hard shell. After the end cap is assembled on a twist-on wire connector one can inject the sealant into the twist-on wire connector through the wire penetrable cap 40. As pointed out the U.S. Pat. No. 5,771,578 shows an automated process of injecting sealant into the twist-on wire connector.

Figure 2A:
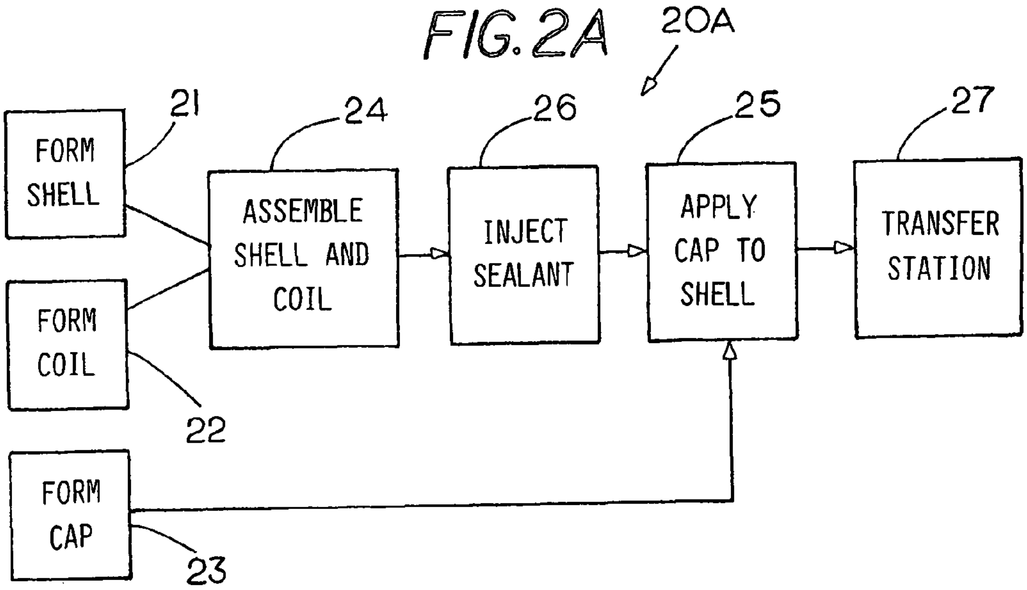
FIG. 2A shows a block diagram of a further example of an alternate system for generating a sealant containing twist-on wire connector with an end cap.

FIG. 2A shows an example of another assembly system 20A including the assembly stations of FIG. 2 except that in the assembly system 20A the cap is applied to the shell after the sealant is placed in the coil as shown by the reversing of the location of station 26 and station 27. However, in each of the systems 20 or 20A one can form a twist-on wire connector with a sealant therein.

As pointed out each of the steps performed in stations 21-27 may be performed by automated apparatus found for example in U.S. Pat. No. 5,771,578 which discloses an automated apparatus and method for manufacturing sealant containing twist-on wire connectors.

A unique aspect of the invention described herein is that one or more of the automated steps in systems 19, 20 or 20A may be performed manually while increasing the efficiency of the method which may also lower the cost of production. In addition, the inventions described herein are well suited for after market production, for example split site manufacturing since preassembled twist-on wire connectors without caps can be purchased in bulk from various manufactures. To use such bulk purchased connectors with an automated system may involve difficulties in developing equipment that performs satisfactorily since each of the manufacturers of twist-on wire connectors may have a different size or shape. With the process described herein one can eliminate problems in handling incorporating connectors of different size and shapes as well as startup costs for manufacture of twist-on wire connectors. For example, one need not invest in the shell forming station 11, the coil forming station 12 and the coil and shell assembly station 13 in order to obtain conventional twist-on wire connectors that can be converted to twist-on wire connectors containing a sealant.

In addition, the step of injecting sealant into a twist-on wire connector such as in station 14 or 26 can also be performed without the aid of complex and costly injection machinery. For example, injection stations 14 or 26 can be maintained by a human operator who handles and or manually injects the sealant into the twist-on wire connectors. Such a human station has further benefits if-various size twist-on wire connector are to be filled with sealant since no specialized equipment is required for a human operator to handle the different shapes and sizes of twist-on wire connectors. Surprisingly, human operators can quickly and efficiently perform manual action steps needed to create twist-on wire connectors contain a sealant. One particular type of action step suited for manual activity is the action step of adjusting to handling different sizes or shapes of twist-on wire connectors.

In the process described herein at least one of the action steps of forming a twist-on wire connector containing a sealant may be performed manually without the aid of automation. In general, an automation process, where action steps are performed without the aid of humans, is often considered superior to systems where action steps are manually performed by humans. Contrary to the perceived beliefs, with the process described herein the efficiency and cost of manufacturing sealant containing twist-on wire connectors may actually be lowered through use of stations where at least one of the action steps of forming a twist-on wire connectors containing a sealant is manually performed by a human operator or are manually assisted by a human operator. By human station it is meant a station where a human operator may manually perform all or a portion of an action step in the creation of a twist-on wire connector containing a sealant either with or without the assistance of a machine for handling the twist-on wire connectors.

A feature of the invention described herein is that sealant containing twist-in wire connectors can at least partially be manually generated by a human operator with out the need for costly investment in automation equipment as well as costs for maintenance of the automation equipment. For example, a human station wherein a human operator manually performs action steps may include a station wherein a coil is manually inserted into a hard shell, a station where sealant is manually injected into the cavity of the coil or a station where a cap is manually placed on the hard shell. An advantage of a human station is that the need for optical sensors to control the assembly as well as a separate station to determine either the presence of the wire connector or that the wire connector has been properly filled is eliminated. Thus, through use of a human station the need for additional stations is minimized since an operator can perform two functions. For example, an operator can both manually inject the sealant into the twist-on wire connector and visually determine if the proper amount of sealant is present in the twist-on wire connector.

Figure 6:
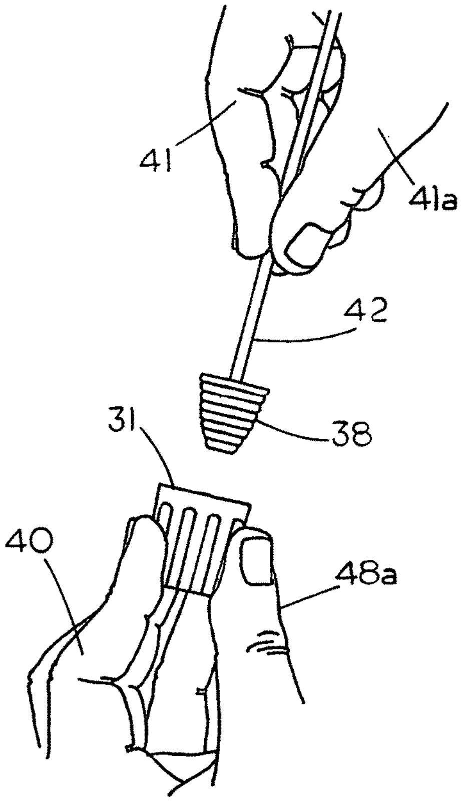
FIG. 6 shows the manual assembly of a spiral coil to a hand held twist-on wire connector.

To illustrate an example of a human station for manual assembly of coils into wire connector shells reference should be made to FIG. 6 which shows the fingers 40 and 40*a* of a person holding a hard shell 31 in an upright condition with the open end of the hard shell facing upward. Located above the hard shell 31 is a shaft 42 with a spiral coil 38 on one end of shaft 42. The other hand of an operator includes fingers 41 and 41*a* that are grasping rod 42 which is supporting spiral coil 38 in a position to be assembled in shell 31.

Figure 6A:
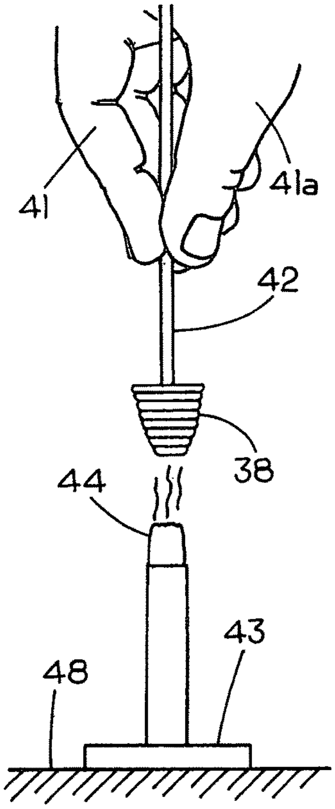
FIG. 6A shows the intermediate step of heating the spiral coil of the twist-on wire connector.

FIG. 6A shows an intermediate step that may be used during the assembly process. In FIG. 6A the coil 38 is heated by a source of heat comprising a burner 43 which is located on platform 48. Flame 44 directs heat onto the coil thus elevating the temperature of the coil prior to inserting the coil into the wire connector shell. In some applications such heating may be used to better secure the coil to the wire connector shell, however, in other assembly steps the heating step may be eliminated. In addition if heating of the coils is used other means and methods of heating the coil may be used, for example, the coils can be maintained in a bin at an elevated temperature so that the coils remain at a proper insertion temperature.

Figure 7:
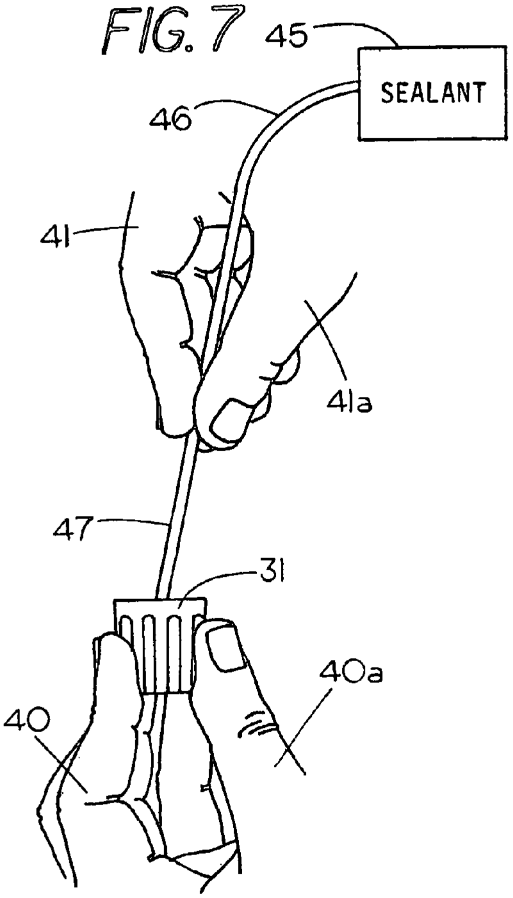
FIG. 7 shows the manual injection of a sealant into a hand held twist-on wire connector.

FIG. 6 illustrates manual insertion of a coil 38 into shell 31 with fingers 41 and 41*a* of one hand holding shaft 42. In the assembly or action step the operator inserts the coil 38 into the hard shell 31. Since the operator must hold the hard shell 31 to insert the coil 38 therein the operator can at the same time the coil is being inserted into the shell determine if the shell and wire connector are properly engaged without the aid of optical sensing devices. If the shell 31 and coil 38 are not in proper engagement the operator's visual viewing of the shell and coil allows the operator to immediately reject the wire connector shell 31 and the coil 38. On the other had if the operator sees that the wire connector shell 31 and coil are properly engaged the operator, who holds shell 31 between fingers 40 and 40*a* of one hand, can as shown in FIG. 7 can manually inject a sealant, from sealant source 45 into shell 31 by grasping insertion tube 47 with the fingers 41 and 41*a* of one hand to manually inject sealant from source 45 through tube 46 and 47.

In the event that the sealant is not properly inserted into shell 31 the operator can visually detect the sealant is not properly injected and can either immediately reject the shell with the improper amount of sealant therein or in the alternative the operator can modify the amount of in the sealant filled twist-on wire connector. Although automation is useful in portions of the process, for example in the manufacture of twist-on wire connectors with coils therein the use of human stations can eliminate steps as well as improve the efficiently of the system. For example, since the person injecting the sealant into the twist-on wire connector is grasping the shell in one hand the operator can visually determine if the shell is properly filled without the extra step of sending the shell with the sealant through a station where an optical sensor determines if the shell is properly filled.

Figure 8:
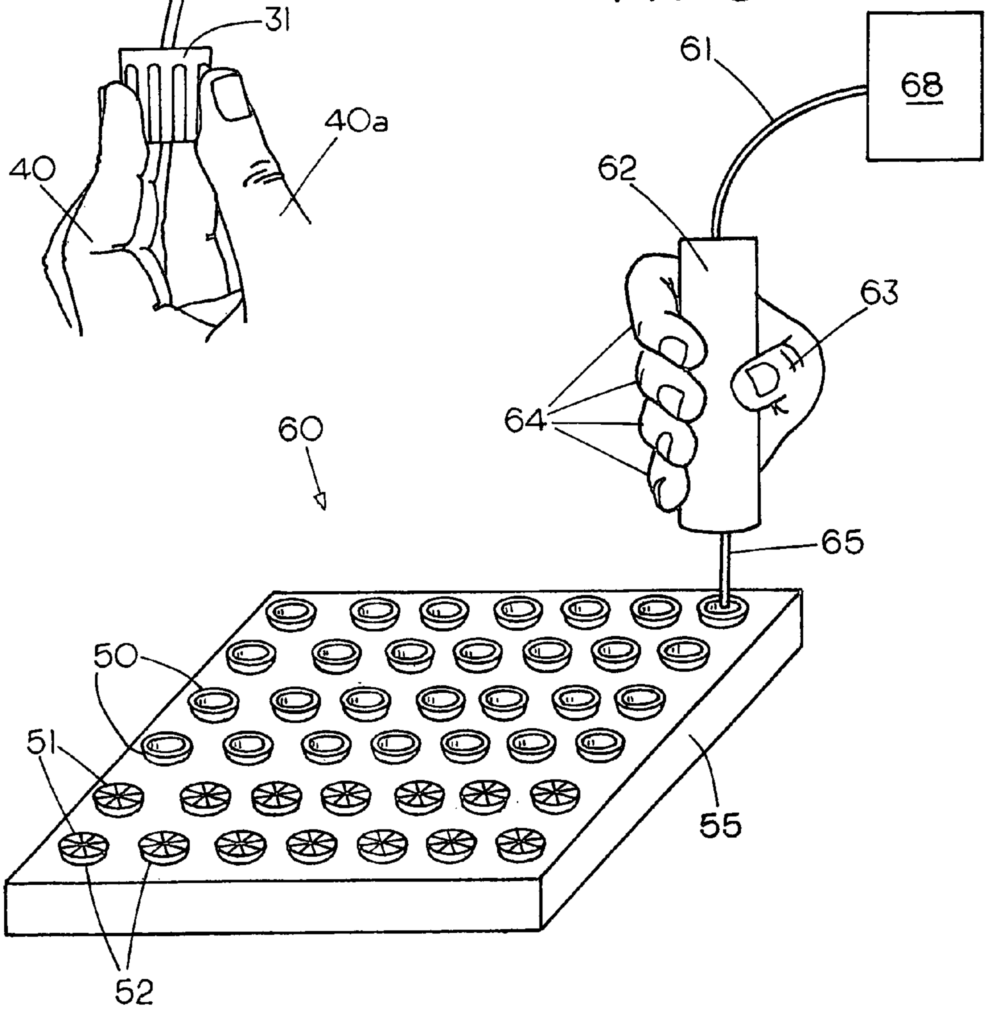
FIG. 8 is a perspective view of a tray holding twist-on wire connectors in a position for hand filling.

FIG. 8 shows another example of a human station 60 wherein the wire connectors are located in a wire connector holder comprising a tray or platform 55 having a plurality of recesses 52 therein for holding twist-on wire connectors in a position whereby sealant can be manually injected therein. Tray 55 is shown containing four rows of twist-on wire connectors 50 without caps and two rows of wire connectors 51 with end caps. The twist-on wire connectors may be individually placed in the cavities of a tray 55 without the aid of automation. For example, a human operator can manually place each of the connectors in the proper cavity or an operator can shake the tray causing the twist-in wire connectors 50 and 51 which caused the twist-on wire connectors to fall into the cavities in the tray 55. Once the twist-on wire connectors are held in position the operator can with thumb 63 and fingers 64 of one hand grasp the injector 62 which is connected to a source of sealant 68 by tubing 61. By squeezing injector 62 sealant can be manually injected into the wire connector through injection tube 65. Although hand pressures is shown as a method of injecting sealant 68 into the wire connectors other methods and apparatus could be used to deliver the proper amount of sealant. For example, a valve that can be opened and closed can be used to deliver the sealant 68 into the twist-on wire connectors 50 or 51.

Figure 9:
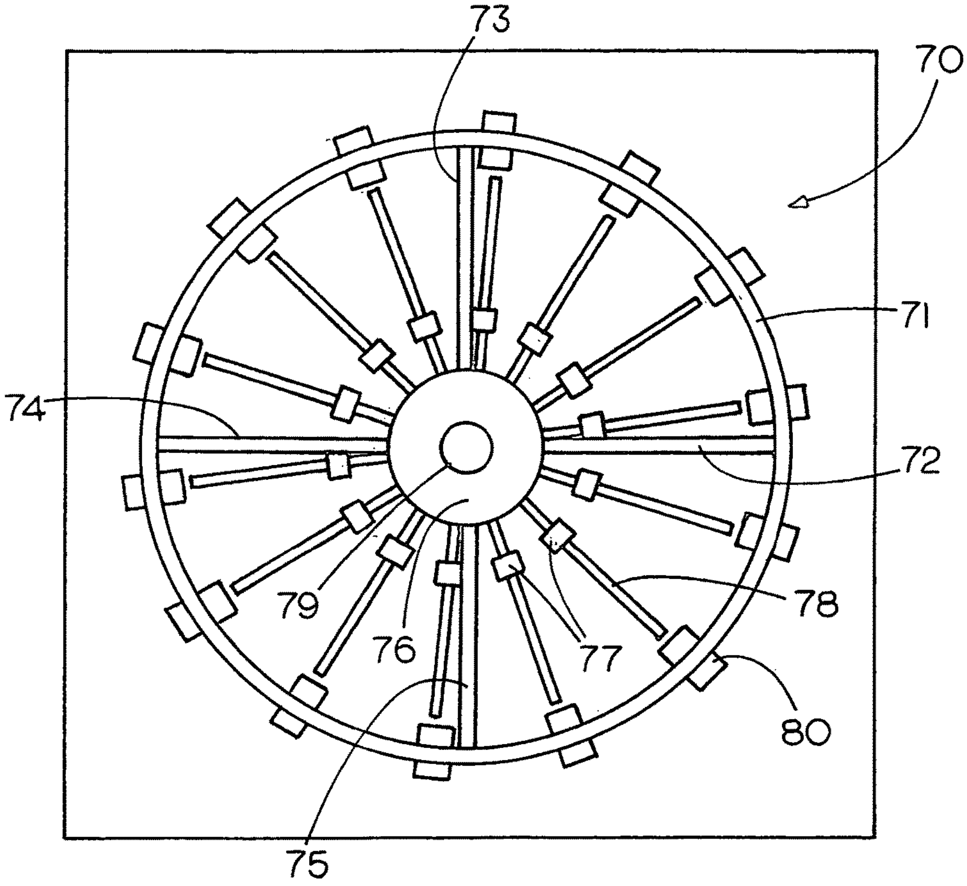
FIG. 9 shows a centrifugal table for manual injecting sealant into twist-on wire connectors.

FIG. 9 shows an alternate method injecting sealant into a twist-on wire connector using a centrifugal apparatus 70. Centrifugal apparatus 70 comprises an outer ring 71 that is supported by spokes 72, 73, 74 and 75 which attach to hub 76 that rotates about shaft 79. The outer ring 71 includes openings therein comprising wire connector holders for individual twist-on wire connectors 80. Each of the wire connectors 80 are located in radial alignment with a nozzle. For example, the open end of twist-on wire connector 80 is located in alignment with nozzles 78. A valve 77 that opens and closes permits passage of sealant threrethrough is located between a source of sealant (not shown) in hub 76. In operation the operator can spin injecting apparatus 70 about shaft 79 which forces the sealant through the radial nozzles and into the cavity in the twist-on wire connector. An advantage of this method is that the injection apparatus can be operated by either a human operator or by a machine. A benefit is that the use of centrifugal force forces the sealant into the closed end of the twist-on wire connector.

Figure 10:
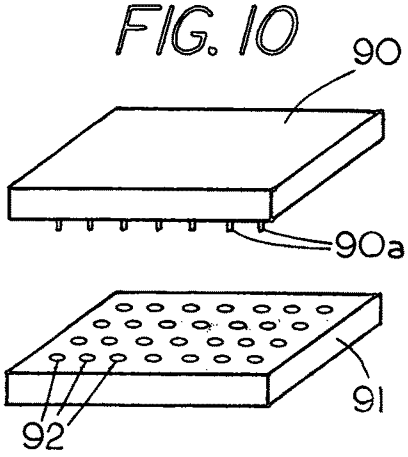
FIG. 10 shows a tray for holding conventional twist-on wire connectors in a position for manual filling with a mating injection pad.
Figure 11:
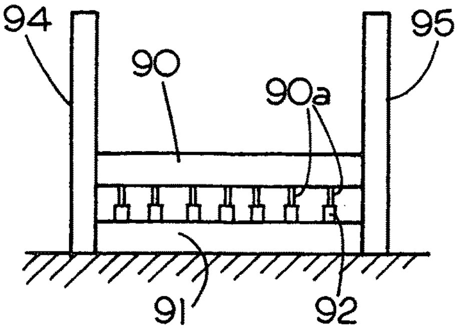
FIG. 11 shows an injection pad for manually filling multiple twist-on wire connectors with sealant.

FIG. 10 shows another system for gang injection of sealant into twist-on wire connectors that are located in a holding tray 91. In this embodiment a top platform 90 with nozzles 90*a* are positioned over the twist-on wire connectors 92 in tray 91. FIG. 11 shows that the platform 90 is raised and lower along side rails 94 and 95 so that when in the lowered position (shown in FIG. 11) the nozzles 90*a* are in alignment with the wire connectors in tray 91. In this example, either a human operator or a machine can be used to lower the nozzles into a delivery position. Once in position the operator can manually and simultaneously inject the sealant from a source (not shown) into all the twist-on wire connectors in tray 91. Once injected with sealant the twist-on wire connectors containing a sealant can be delivered to a transfer station such as station 15 or 27.

Figure 12:
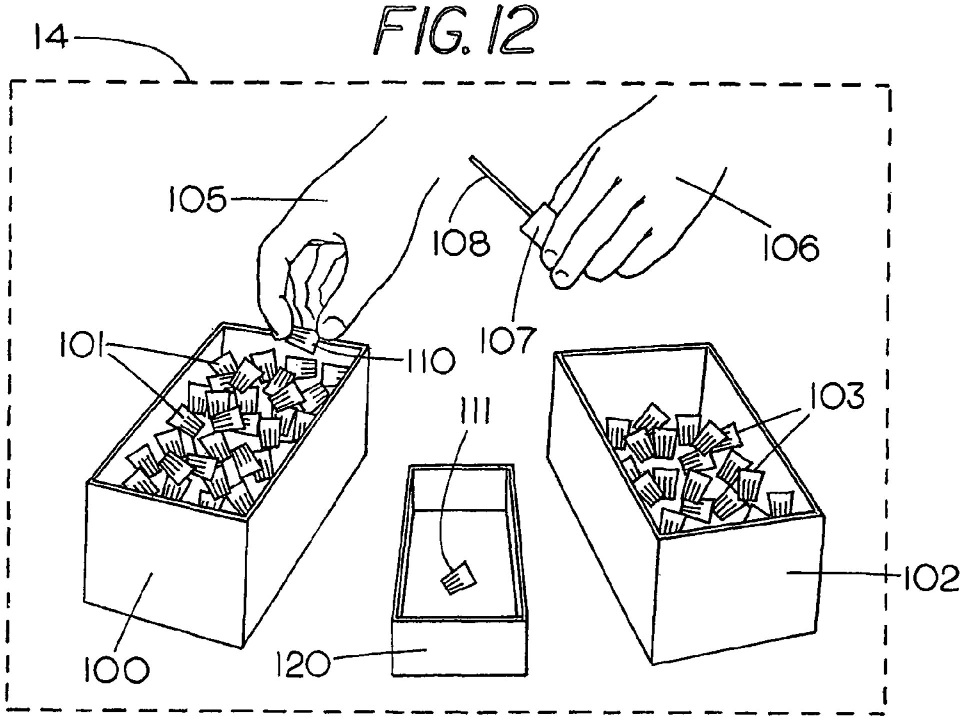
FIG. 12 shows an operator station with an operator manually removes twist-on wire connectors from a bin.

FIG. 12 shows a station 14 during an action step in the injection of sealant into a twist-on wire connector. Station 14 includes a hand accessible twist-on wire connector bin 100 containing conventional twist-on wire connectors 101 (twist-on wire connectors that do not contain a sealant) and a twist-on wire connector bin 102 containing sealant containing twist-on wire connectors 103. A third bin 120 for receiving improperly filled twist-on wire connectors is located between bins 101 and 102 and contains a rejected twist-on wire connector 111. In the step of manual injection of sealant into the twist-on wire connector the operators hand 105 plucks a twist-on wire connector 110, which is free of sealant, from bin 100 by grasping twist-on wire connector 110 in his or her fingers of one hand. With the other hand 106 the operator operates a hand held sealant injector 107 having an elongated nozzle 108 for insertion into the open end of a twist-on wire connector.

Figure 12A:
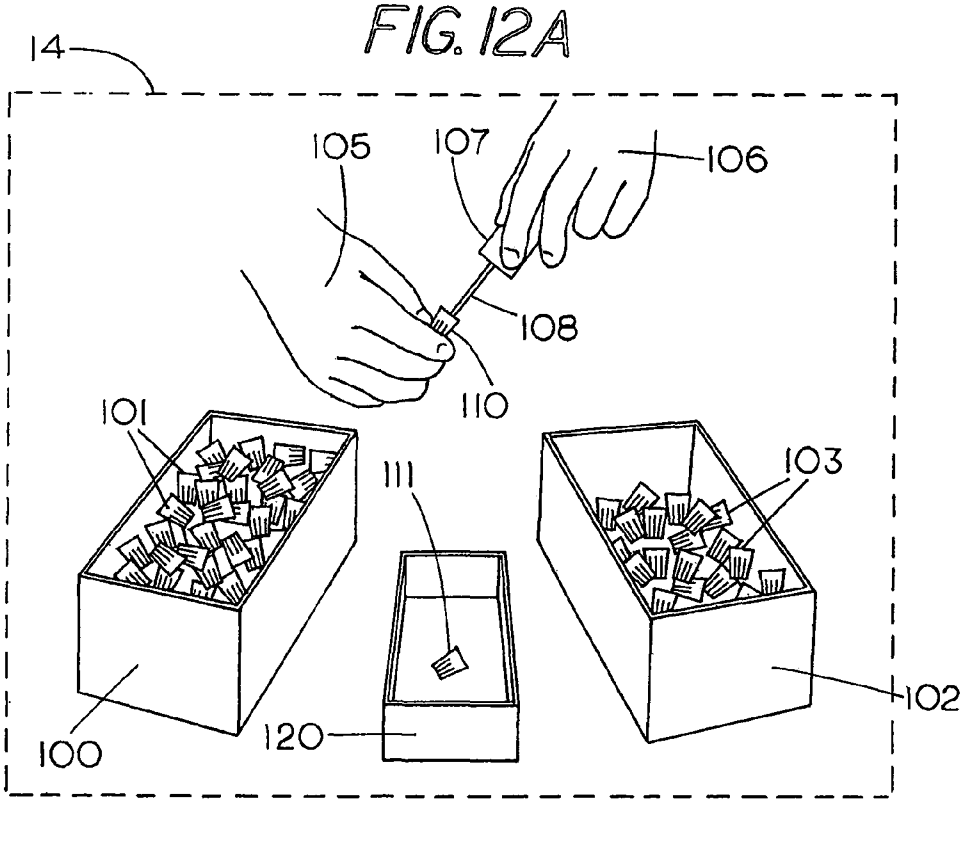
FIG. 12A shows the operator station wherein the operator manually injects sealant into the twist-on wire connector.

FIG. 12A shows the action being performed in station 14 during the action step of injection of sealant into the twist-on wire connector. The operator's hand 105 holds twist-on wire connector 110 in a grasping zone, that is that outside surface portion of the twist-on wire connector to enable access to the open end of the twist-on wire connector position where the nozzle 108 can be directed into the open end of the wire connector 108 by the other hand of the operator. Once the nozzle 108 is in position the operator manually injects sealant into the twist-on wire connector 110 through sealant injector 107. In the second step the operator visually aligns the nozzle with the open end of the wire connector. In doing so the operator can also perform a visual inspection to determine if the twist-on wire connector is properly filled. For example, if an operator determines that a twist-on wire connector is improperly filled the operator drops the twist-on wire connector 111 into the recycle bin 120.

Figure 12B:
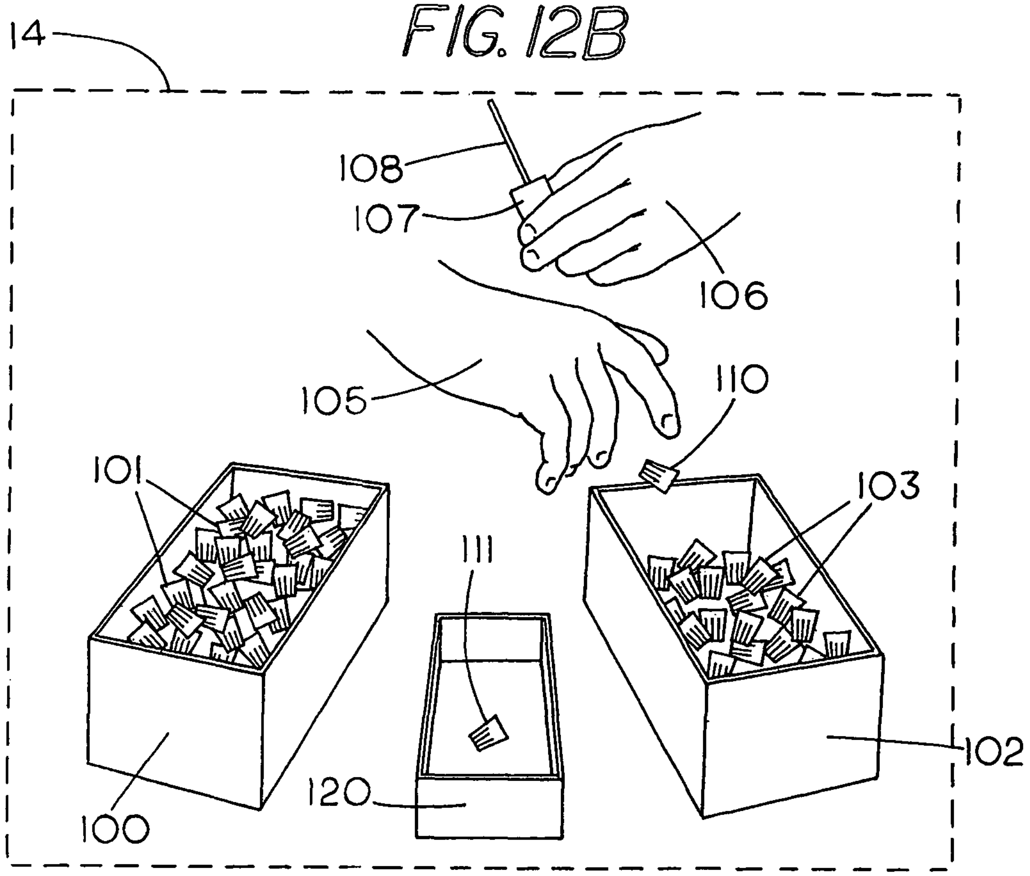
FIG. 12B shows the operator manually placing the twist-on wire connector containing a sealant in a bin for transfer.

FIG. 12B shows the station 14 during an action step in the injection of sealant into the twist-on wire connector. In the third step the operator's hand 105 releases the twist-on wire connector 110, which has now received sealant into the bin 102 for transfer to a remote location.

Thus, FIG. 12-12B illustrate a manual method of making a sealant containing twist-on wire connector comprising placing a plurality of conventional twist-on wire connectors 101 in a hand accessible location such as a bin 100. In the next step one hand grasps a conventional twist-on wire connector in a grasping zone and with the other hand the operator manually injects a sealant into the conventional twist-on wire connector and then upon visual inspection places the conventional twist-on wire connector in either a transfer bin or a recycle bin.

We claim:

1. A method of forming a sealant containing twist-on wire connector comprising the steps of:

forming a twist-on wire connector shell;

forming a coil;

assembling the wire connector shell and the coil by placing the coil in an interior pocket of the twist-on wire connector shell at a first location;

injecting a sealant into a cavity of the coil at a human station located remote from the first location to form a sealant containing twist-on wire connector; and rejecting a faulty sealant containing twist-on wire connector wherein at least one of the steps of the assembling, the injecting or the rejecting is performed manually.

2. The method of claim 1 wherein an operator manually injects the sealant into the cavity of the twist-on wire connector with a hand held sealant injector while visually determining if the twist-on wire connector is acceptable.

3. The method of claim 2 wherein a wire penetrateable end cap is placed on the twist-on wire connector shell before injecting the sealant into the cavity of the coil.

4. The method of claim 3 including the step of holding the twist-on wire connector in one hand and manually injecting the sealant into the cavity of the coil with the other hand.

5. The method of claim 1 wherein the human station includes an operator holding a sealant injector in one hand while injecting sealant into the cavity of the coil.

6. The method of claim 5 wherein the operator uses a first hand to grasp and hold the twist-on wire connector having a coil and the other hand to inject sealant into the cavity of the coil.

7. The method of claim 6 wherein the operator visually inspects the twist-on wire connector to determine if the proper amount of sealant is present in the twist-on wire connector.

* * * * *